United States Patent [19]
Gustafsson

[11] 4,415,865
[45] Nov. 15, 1983

[54] CIRCUIT ARRANGEMENT FOR CONTROLLING THE QUIESCENT CURRENT IN A CLASS AB AMPLIFIER STAGE

[75] Inventor: Rolf E. O. Gustafsson, Huddinge, Sweden

[73] Assignee: Telefonaktiebolaget L M Ericsson, Stockholm, Sweden

[21] Appl. No.: 246,910

[22] Filed: Mar. 23, 1981

[30] Foreign Application Priority Data

Apr. 1, 1980 [SE] Sweden ................................ 8002484

[51] Int. Cl.³ .......................... H03F 1/34; H03F 3/26
[52] U.S. Cl. ..................................... 330/271; 330/77
[58] Field of Search .................. 330/271, 273, 270, 77

[56] References Cited

U.S. PATENT DOCUMENTS 3,399,355 8/1968 Ault ..................................... 330/271

FOREIGN PATENT DOCUMENTS 1201516 8/1970 United Kingdom .
1303505 1/1973 United Kingdom .
1329090 9/1973 United Kingdom .
1366392 9/1974 United Kingdom .

Primary Examiner—James B. Mullins
Assistant Examiner—Gene Wan
Attorney, Agent, or Firm—Hane, Roberts, Spiecens & Cohen

[57] ABSTRACT

A circuit arrangement incorporated in a class AB amplifier for controlling the quiescent current through the transistors (T1, T2) incorporated therein so that the load current ($I_L$) is zero when the input voltage ($I_{IN}$) to the amplifier is zero. The arrangement comprises two feedback loops, each connected to the base circuits of both amplifier transistors. One feedback loop comprises a sensing resistor (R1) connected to the load (Z), an adder (S1) and an amplifier element (A1) with high gain and input impedance. The second feedback loop comprises a sensing resistor in the main current flow of the second transistor (T2), an adder (S2) and an amplifier element (A2) of the same kind as the first one (A1). The degree of feedback in the second loop is suitably selected greater than that of the first loop to achieve a greater control range for the amplifier.

5 Claims, 2 Drawing Figures

CIRCUIT ARRANGEMENT FOR CONTROLLING THE QUIESCENT CURRENT IN A CLASS AB AMPLIFIER STAGE

TECHNICAL FIELD

The present invention relates to a circuit arrangement for controlling the quiescent current (zero current) in a class AB amplifier stage. An area of application for such amplifiers is the control of the current fed to the deflection coils in graphic image screens.

BACKGROUND ART

An amplifier stage operates in class A if the included amplifying elements, usually transistors, are biassed so that they operate within their linear (active) range for all the input signals to the amplifier. In a class B amplifier stage, the included transistors are biassed so that they are controlled to full conductive or non-conductive stage for input signals of given polarity. In such amplifier stages where the input signal is sinusoidal, for example, a transistor is controlled to conductive stage during one half-period of the input signal, while the transistor is blocked during the other half-period. A second transistor is therefore provided in the amplifier, which is controlled to a conductive stage during the second half-period, so that am amplified output signal is obtained during both half-periods of the input signal.

A class AB amplifier stage operates substantially as a class B amplifier stage. In a range around zero where the load current reverses, however, both amplifying elements are conductive in class AB. The current flowing through both amplifying elements when the load current is zero is designated zero current, or quiescent current. Previously known amplifier circuits for controlling the quiescent current are described in, for example, the German "Offenlegungsschrift" Nos. 22 52 666 and 26 14 399.

DISCLOSURE OF INVENTION

An object of the present invention is to provide a circuit arrangement in an AB class amplifier, in which the quiescent current can be controlled by negative feedback with the same accuracy as the input signal to the amplifier.

BRIEF DESCRIPTION OF DRAWING

The invention will now be described in detail with reference to the accompanying drawing, in which.

MODES FOR CARRYING OUT THE INVENTION

Figure 1:
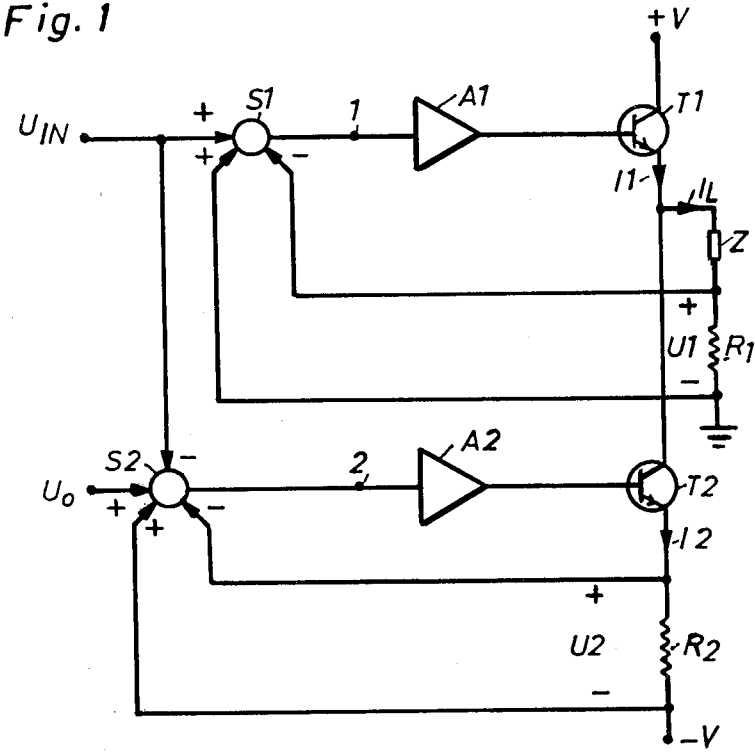
FIG. 1 illustrates a circuit diagram for a class AB amplifier in which the circuit arrangement in accordance with the invention has been incorporated.

A class AB amplifier stage divided into two separate negative feedback loops is illustrated in FIG. 1. The first negative feedback loop includes an adder S1, which receives the incoming signal voltage $U_{IN}$ on a plus input. The output of the circuit S1 is connected to the input of an amplifier A1 with very high open loop gain and input impedance $(A, Z_{in} \approx \infty)$. The output of the amplifier A1 is connected to the base of a transistor, illustrated in FIG. 1 as a bipolar n-p-n transistor, which is connected into the main current path of the amplifier stage between both terminals $+V$, $-V$ of a supply voltage source. A load Z, e.g., the inductance of a deflecting coil, is in series with a resistor R1 connected to a reference potential (earth of ground). The voltage drop U1 across the sensing resistor R1 is connected across a second plus input and a minus input of the adder S1 so that the negative feedback loop is obtained. The current $I_L$ through the load is thus sensed by the resistor R1 and is fed back via the adder S1 to the input of the amplifier A1.

The second negative feedback loop includes a second adder S2, an amplifier A2 with high open loop gain and input impedance, an n-p-n transistor T2 and a resistor R2 connected to the second terminal $-V$ of the supply voltage source. The current I2 through the transistor T2, i.e., in the amplifier stage main current path, is sensed by the resistor R2, and a voltage U2 proportional to this current is connected to the adder S2 in the same way as in the first negative feedback loop.

The amplifier stage operates such that when a certain quiescent voltage Uo is connected and the input voltage $U_{IN}=0$, both the transistors are controlled such that they operate within their linear range and a given quiescent current Io flows into the main current path of the amplifier stage between the two terminals, $+V$, $-V$ of the biassing source. The demand on the amplifier stage is thus that the current $I_L$ through the load Z shall be zero, since $U_{IN}=0$. If it is assumed that the quiescent voltage Uo is positive relative to reference ground, then the voltage drop across the resistor R2 is equal to $R2 \cdot I2 = Uo$, since $Uo > 0$ and the point 2 is at a potential close to 0 (virtual ground) due to the high gain in the amplifier A2, i.e., $$I1 = Uo/R2$$

The voltage drop across the resistor R1 is simultaneously equal to $R1 \cdot I_L = 0$, since $U_{IN}=0$, i.e., $$I_L = 0.$$

The current through the load is thus equal to zero when the input signal is equal to zero, and the quiescent current $Io = I1 = I2 = Uo/R2$ is determined solely by the quiescent voltage Uo and the resistor R2.

For $U_{IN} \leq Uo$, the load current $I_L$ flows through the transistor T1. In addition, the quiescent current Io flows through the transistors T1 and T2 as well as possibly an excess current, if $R2 < R1$.

For $U_{IN}=0$, the quiescent current Io flows through both transistors T1 and T2. The load current $I_L$ is then $=0$. For $U_{IN} > Uo$, the load current $I_L$ is conducted through the transistor T1. The current I2 is then $=0$. The following relationship is valid:

$$I_L = U_{IN}/R1$$

$$I2 = (Uo - U_{IN})/R2 = Io - U_{IN}/R2 \text{ for } I2 > 0$$

$$I1 = I_L + I2 \text{ for } I1 > 0$$

The load current $I_L$ is thus determined solely by the first negative feedback loop containing the resistor R1 and the input voltage $U_{IN}$.

Figure 2:
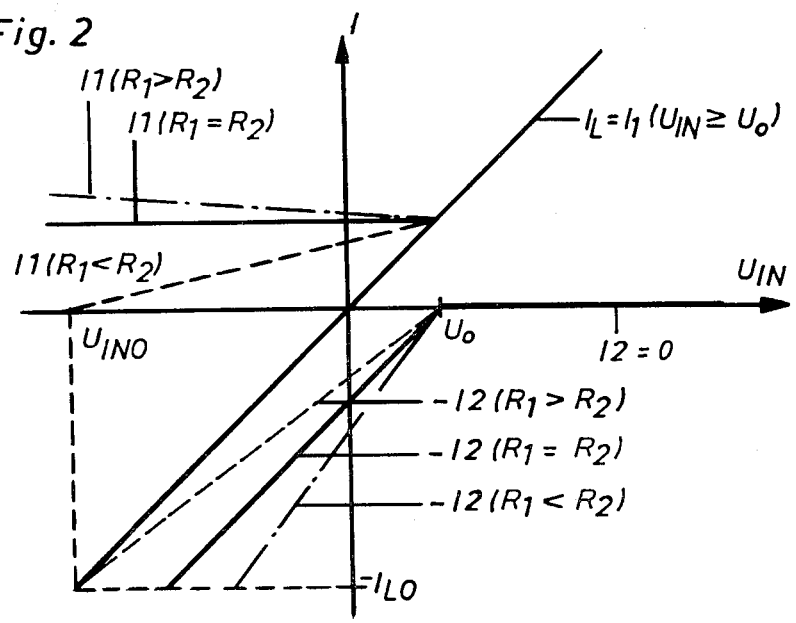
FIG. 2 is a diagram over the relationship between certain quantities occurring in the circuit diagram according to FIG. 1.

The diagram according to FIG. 2 illustrates the variation of the transistor currents I1 and I2 and the load current $I_L$ (for $I1 > 0$) as a function of the input voltage $U_{IN}$. For $U_{IN} \geq Uo$, $I2=0$ in accordance with the above, and the load current solely consists of the current I1 through the transistor T1. For $U_{IN} \leq Uo$, the current $I_L$ is composed of both currents I1 and I2, but the load current value is equal to $U_{IN}/R1$, i.e. solely dependent on the first negative feedback loop and the input voltage $U_{IN}$. The diagram according to FIG. 2 shows, however, that the transistor currents I1 and I2 have different values depending on the degree of negative feedback in both loops. This is determined by the value of the sensing resistors R1 and R2, respectively.

For $R1 > R2$, the transistor current I1 increases pro rata with increasing negative value of the input voltage $U_{IN}$, the transistor current $-I2$ decreasing to a corresponding degree, so that the load current continuously decreases in proportion to $-U_{IN}$, see the dash-dotted lines in FIG. 2.

For $R1 < R2$ instead, the current I1 diminishes towards zero when $U_{IN}$ increases towards a higher negative value, and the current I2 diminishes less than in the previous case, of the dashed lines in FIG. 2. Since the current I1 must be greater than zero, there is obtained in this case a limitation of the control range of the amplifier for the input value $U_{IN_o}$ and the load current value $I_{L_o}$. In the boundary case (full lines in FIG. 2) when $R1 = R2$ there is obtained that $I1 = Io$ and I2 will be equal to the load current minus the constant quiescent current Io.

It is obvious that such an amount of negative feedback of the amplifier determined by the condition $R1 > R2$ according to the above is to be preferred, since this gives a large control range for the input voltage $U_{IN}$. In the case where $R1 > R2$, there is obtained, according to FIG. 2, a limitation of the input voltage $U_{IN}$ and the load voltage $I_1$.

The circuit arrangement in accordance with the invention can also be applied in such amplifiers which utilize, instead of bipolar transistors according to FIG. 1, MOS transistors, e.g., of the VMOS type. Similarly, the arrangement can be applied when the transistors T1 and T2 are arranged complementary, whether they are bipolar or of the MOS type.

What we claim is:

1. A quiescent controlled class AB amplifier comprising a supply voltage source having first and second terminals, first and second amplifiers each having input, output and common terminals, means for connecting the common terminal of said first amplifier to the first terminal of said supply voltage source, first impedance means for connecting the output terminal of said second amplifier to the second terminal of said supply voltage source, means for connecting the output terminal of said first amplifier to the common terminal of said second amplifier, a reference potential source, a load having one terminal connected to the output terminal of said first amplifier and another terminal, second impedance means connecting the other terminal of said load to said reference voltage source, a source of an input signal to be amplified, first signal processing means for subtracting a voltage developed across said first impedance means from the input signal to provide a difference signal, first connecting means for connecting the output of said first signal processing means to the input terminal of said first amplifier, a source of constant quiescent voltage, a second signal processing means for adding to the inverse of said input signal to the constant quiescent voltage and subtracting therefrom a voltage developed across said second impedance means, and second connecting means for connecting the output of said second signal processing means to the input terminal of said second amplifier.

2. The quiescent controlled class AB amplifier of claim 1 wherein said first and second impedances are respectively first and second resistors.

3. The quiescent controlled class AB amplifier of claim 2 wherein the resistance of said first resistor is geater than the resistance of said second resistor.

4. A class AB amplifying circuit having a first amplifier element for conducting a first main current in response to an input signal voltage to the circuit, and a second amplifier element for conducting a second main current in response to the input signal and a constant quiescent voltage to the circuit, a load connected to a connection point between the first and second amplifier elements, and to a terminal for connection to a first reference potential in use of the circuit, a circuit arrangement for controlling the quiescent current in the amplifying circuit comprising a first negative feedback loop to the first amplifier element, said first loop comprising (1) a first sensing element connected in the circuit of the load for sensing the load current and for forming a first quantity, the value of which is dependent on the load current, and a first adder means, a first operational amplifier connecting said first adder means to a control electrode of the first amplifier element for adding the input signal and, in opposite phase, said first quantity, and (2) a second negative feedback loop to the second amplifier element, said loop comprising a second sensing element connected in a main current path for sensing the second main current and for forming a second quantity, whose value depends on the second main current, and a second adder means connected, a further operational amplifier for connecting said second adder means to a control electrode of the second amplifier element for adding said quiescent voltage and, in opposite phase, both said second quantity and the input signal.

5. A circuit as claimed in claim 4, wherein the first sensing element comprises a resistor connected in series with an impedance, which forms said load, and the second sensing element comprises a resistor connected to an output electrode of the second amplifier element and to a terminal for connection to a second reference potential.

* * * * *